(12) United States Patent
Rozman et al.

(10) Patent No.: US 8,553,373 B2
(45) Date of Patent: Oct. 8, 2013

(54) SOLID STATE POWER CONTROLLER FOR HIGH VOLTAGE DIRECT CURRENT SYSTEMS

(75) Inventors: Gregory I. Rozman, Rockford, IL (US); Steven J. Moss, Rockford, IL (US)

(73) Assignee: Hamilton Sundstrand Corporation, Windsor Locks, CT (US)

(*) Notice: Subject to any disclaimer, the term of this patent is extended or adjusted under 35 U.S.C. 154(b) by 29 days.

(21) Appl. No.: 13/218,174

(22) Filed: Aug. 25, 2011

(65) Prior Publication Data

US 2013/0050880 A1 Feb. 28, 2013

(51) Int. Cl.
*H02H 7/00* (2006.01)

(52) U.S. Cl.
USPC .................................. 361/8; 361/9

(58) Field of Classification Search
USPC .................................. 361/2, 3, 8, 9
See application file for complete search history.

(56) References Cited

U.S. PATENT DOCUMENTS

| | | | |
|---|---|---|---|
| 4,420,784 A * | 12/1983 | Chen et al. | 361/7 |
| 4,638,175 A | 1/1987 | Bradford et al. | |
| 5,291,143 A | 3/1994 | Cronauer | |
| 5,350,997 A | 9/1994 | Ghotbi et al. | |
| 5,422,517 A | 6/1995 | Verney et al. | |
| 5,455,731 A | 10/1995 | Parkinson | |
| 5,495,155 A | 2/1996 | Juzswik et al. | |
| 5,752,047 A | 5/1998 | Darty et al. | |
| 6,072,673 A * | 6/2000 | Chen et al. | 361/9 |
| 6,154,379 A | 11/2000 | Okita | |
| 6,577,138 B2 | 6/2003 | Zuercher et al. | |
| 6,643,112 B1 * | 11/2003 | Carton et al. | 361/152 |
| 7,315,774 B2 | 1/2008 | Morris | |
| 7,453,680 B2 | 11/2008 | Hallak et al. | |
| 7,595,613 B2 | 9/2009 | Thompson et al. | |
| 7,741,883 B2 | 6/2010 | Fuller et al. | |
| 7,830,071 B2 | 11/2010 | Abramovich et al. | |
| 7,847,429 B2 | 12/2010 | Miyama et al. | |
| 7,952,225 B2 | 5/2011 | Reichard et al. | |
| 2004/0156154 A1 | 8/2004 | Lazarovich et al. | |
| 2008/0106152 A1 | 5/2008 | Maier | |
| 2008/0143462 A1 * | 6/2008 | Belisle et al. | 335/201 |
| 2009/0295341 A1 | 12/2009 | Nakamura et al. | |
| 2010/0254046 A1 * | 10/2010 | Liu et al. | 361/8 |

FOREIGN PATENT DOCUMENTS

| DE | 19607669 A1 | 9/1997 |
|---|---|---|
| EP | 1921531 A1 | 5/2008 |

OTHER PUBLICATIONS

European International Search Report dated Dec. 20, 2012 for Application No. 12181229.1-1233.

* cited by examiner

*Primary Examiner* — Danny Nguyen
(74) *Attorney, Agent, or Firm* — Cantor Colburn LLP

(57) ABSTRACT

A solid state power controller system can include a direct current load, a solid state power controller apparatus including an alternating current sensor coupled to the direct current load, a direct current sensor coupled to the direct current load, a voltage sensor coupled to the direct current load, a main switch coupled to the direct current load via the alternating and direct current sensors, an auxiliary switch coupled in parallel to the main switch, a current limiting resistor coupled in series to the auxiliary switch and a solid state power controller coupled to the main switch, the auxiliary switch, the alternating current sensor, the direct current sensor, and the voltage sensor, and a direct current power source coupled to the solid state power controller apparatus.

17 Claims, 5 Drawing Sheets

SOLID STATE POWER CONTROLLER FOR HIGH VOLTAGE DIRECT CURRENT SYSTEMS

BACKGROUND OF THE INVENTION

The subject matter disclosed herein relates to electric power generation and distribution, and more particularly to a solid state power controller (SSPC) for high voltage direct current (DC) systems.

Electrical power systems in hybrid vehicles, such as military hybrid vehicles, can include high voltage direct current power generation and distribution systems. SSPCs can be used in a power distribution system to replace traditional electromechanical circuit breakers. The main functions of the SSPCs can include power distribution and protection of power to different loads. In comparison to electromechanical devices, SSPCs provide fast response time, and eliminate arcing during turn-off transients and bouncing during turn-on transients. In addition, SSPCs do not suffer severe degradation during repeated fault isolation as compared with electromechanical devices. SSPCs facilitate advanced protection and diagnostics, and provide more efficient power distribution architectures and packaging techniques, due to the smaller size and weight of SSPCs. However, switching devices within current SSPCs typically dissipate excessive heat at elevated current levels due to internal resistances, which results in the need for various thermal management techniques that add complexity, cost and weight to the system including the SSPCs.

BRIEF DESCRIPTION OF THE INVENTION

Exemplary embodiments include a solid state power controller system, including a direct current load, a solid state power controller apparatus including an alternating current sensor coupled to the direct current load, a direct current sensor coupled to the direct current load, a voltage sensor coupled to the direct current load, a main switch coupled to the direct current load via the alternating and direct current sensors, an auxiliary switch coupled in parallel to the main switch, a current limiting resistor coupled in series to the auxiliary switch and a solid state power controller coupled to the main switch, the auxiliary switch, the alternating current sensor, the direct current sensor, and the voltage sensor, and a direct current power source coupled to the solid state power controller apparatus.

Additional exemplary embodiments include a solid state power controller apparatus, including an alternating current sensor coupled to a direct current load, a direct current sensor coupled to the direct current load, a voltage sensor coupled to the direct current load, a main switch coupled to the direct current load via the alternating and direct current sensors, an auxiliary switch coupled in parallel to the main switch, a current limiting resistor coupled in series to the auxiliary switch and a solid state power controller coupled to the main switch, the auxiliary switch, the alternating current sensor, the direct current sensor, and the voltage sensor.

Further exemplary embodiments include a direct current load protection method in a high voltage direct current system, the method including in response to a detection of an over current condition, turning off a main switch in the high voltage direct current system, and turning on an auxiliary switch in the high voltage direct current system to current limit the over current through a current limiting resistor coupled to the auxiliary switch and in response to the over current exceeding a predetermined level for more than a predetermined period of time, turning off the auxiliary switch.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION OF THE INVENTION

Figure 1:
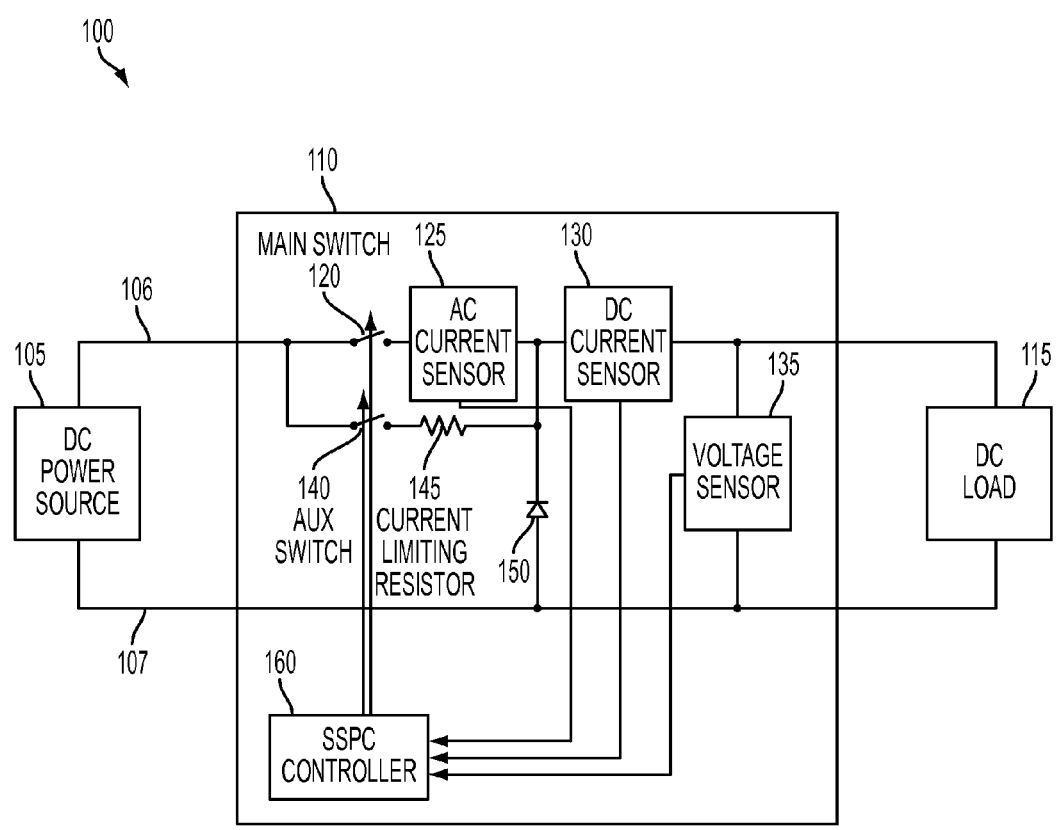
FIG. 1 illustrates an SSPC high voltage DC system.

Exemplary embodiments include a SSPC in a DC power distribution system, enabling distribution and protection of DC loads, such as DC link motor controllers and export power inverters, or other types of DC loads. The architecture described herein utilizes an SSPC with two solid state circuit breakers coupled to current and voltage sensors. The main switch utilizes a high bandwidth alternating current (AC) current sensor to detect over current condition. Once the over current condition is detected, the main switch is turned-off and load current is limited by the auxiliary switch via current limiting resistor. If the load current measured by the DC current sensor is above threshold level for pre-determined period of time, the auxiliary switch is turned off and short circuit/overcurrent condition is announced by the protective function. FIG. 1 illustrates an SSPC high voltage DC system 100. As described herein, high voltage can be 600-800 VDC. The system 100 includes a DC power source 105, having a positive rail 106 and a negative rail 107. In one embodiment, the DC power source 105 can be any power source that can output a large inrush of current during channel closure into a capacitive load or short circuited faulty load. This inrush current may adversely affect power quality. The system 100 further includes a SSPC section 110 coupled to the DC power source 105. The SSPC section 110 is coupled to a DC load 115. In one embodiment, the SSPC section 110 detects the nature of inrush current and actively limits the current during the detection period to ensure good power quality, while avoiding damage to the DC load 115.

The SSPC section 110 includes a main switch 120 coupled to an alternating current (AC) current sensor 125 serially connected with a DC current sensor 130. The SSPC section 110 further includes a voltage sensor 135 coupled between the positive rail 106 and the negative rail 107 of the DC power source 105. The SSPC section 110 further includes an auxiliary switch 140 coupled in parallel with the main switch 120. In one embodiment, the main switch 120 and the auxiliary switch 140 are solid state circuit breakers. The auxiliary switch 140 is also coupled to one end of current limiting resistor 145. An overvoltage protection diode 150 bridges the positive rail 106 and a negative rail 107 of the DC power source 105. The overvoltage protection diode 150 prevents overvoltage during the switching operations described herein. The other end of the current limiting resistor 145 coupled to the DC load 115. The SSPC section 110 further includes an SSPC controller 160 coupled to the main switch 120, the auxiliary switch 140, the AC current sensor 125, the DC current sensor 130 and the voltage sensor 135.

In one embodiment, the SSPC controller 160 can perform several functions. During an initial start of the system, the auxiliary switch 140 is turned on prior to turning on the main switch 120. If the over current is detected by the DC current sensor 130, the auxiliary switch 140 is turned off and short circuit condition is announced by the protective function. However, if the over current is reduced and load voltage is below threshold level, SSPC controller 160 would announce pre-charge function active and wait until the output voltage reaches predetermined DC bus level. After detecting the predetermined voltage level, SSPC controller 160 will command closure of the main switch 120 and announce a power ready signal.

If the high bandwidth AC current sensor 125 detects over current conditions in the system 100, then the AC current sensor 125 signals the SSPC controller 160 that an over current condition exists. In response to the over current condition, the SSPC controller 160 switches off the main switch 120 and turns on the auxiliary switch 140. Thus, the current provided to the load 115 is limited by the auxiliary switch 140 via the current limiting resistor 145. If the load current measured by the DC current sensor 130 is detected as above a predetermined threshold level for pre-determined period of time, then the DC current sensor 130 signals the SSPC controller 160 that the load current is above the predetermined threshold level. In response to the load current being above the predetermined threshold level for pre-determined period of time, the SSPC controller 160 switches off the auxiliary switch 140, and the SSPC controller 160 generates an indication that a short circuit condition exists.

Figure 2:
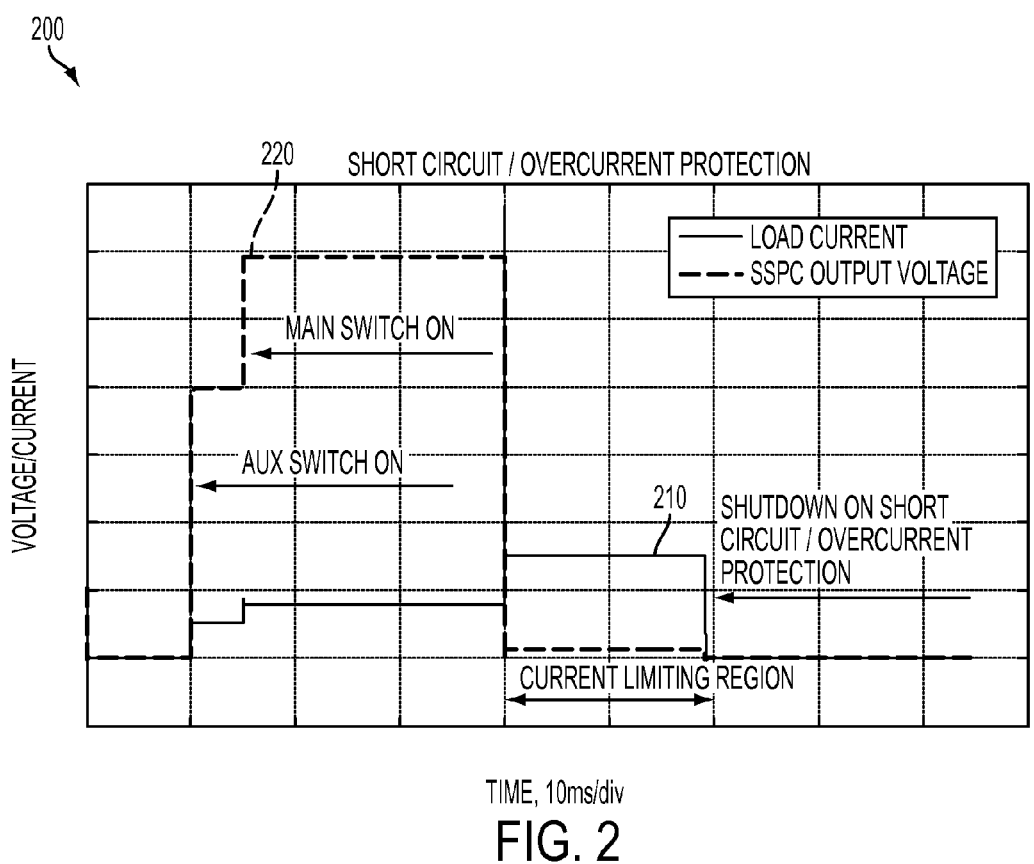
FIG. 2 illustrates an example graph of a load current plot and an SSPC output voltage plot in a system with a short-circuited/overcurrent load.

FIG. 2 illustrates an example of a graph 200 showing a load current plot 210 and an SSPC output voltage plot 220, both versus time, in a system with a short-circuited load. FIG. 2 illustrates that the system 100 initially turns on the auxiliary switch 140 at approximately 10 ms, then the main switch 120 shortly thereafter. FIG. 2 shows a current limiting region between 40 and 60 ms, when the auxiliary switch 140 is turned on, and then a shut down in response to the short circuit protection function at approximately 60 ms.

In one embodiment, during an initial start of the system, the SSPC controller 160 turns on the auxiliary switch 140 prior to turning on the main switch 120. Thus, the load current is limited by the auxiliary switch 140 via the current limiting resistor 145. If the DC current sensor 130 detects an over current condition, then the DC current sensor 130 signals the SSPC controller 160. In response to the over current condition, the SSPC controller 160 turns off the auxiliary switch 140, and indicates a short circuit/overcurrent condition via the protective function.

Figure 3:
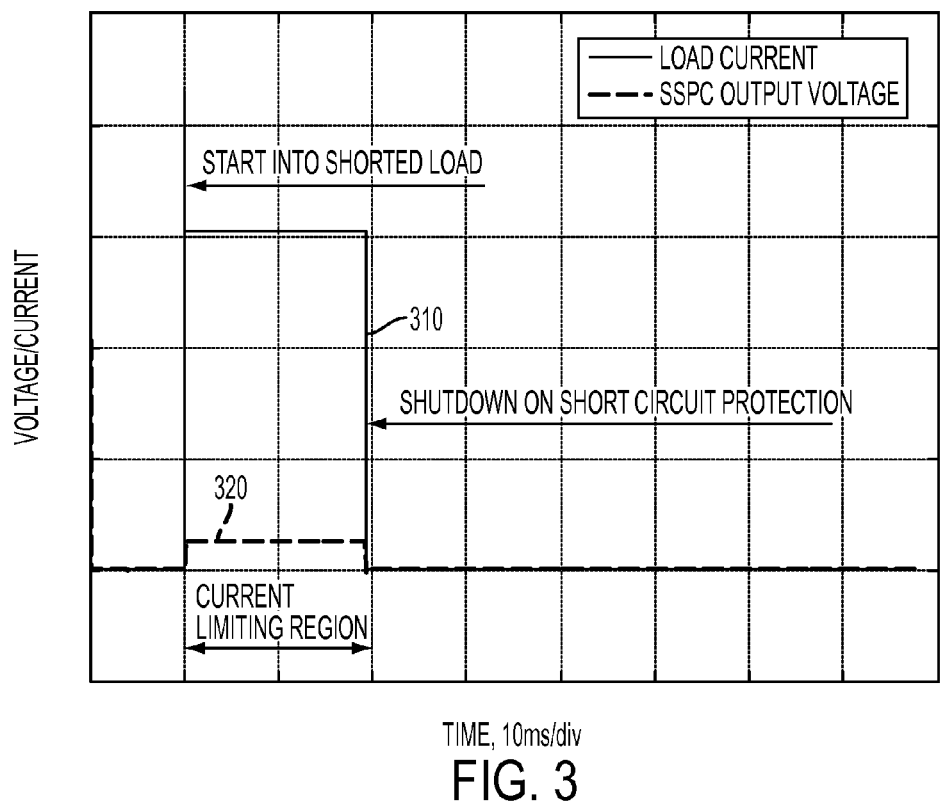
FIG. 3 illustrates an example graph of a load current plot and an SSPC output voltage plot illustrating SSPC switching into a shorted/overcurrent load.

FIG. 3 illustrates an example of a graph 300 showing a load current plot 310 and an SSPC output voltage plot 320, both versus time, where SSPC controller 160 is switching into a shorted load. This short is detected as limited in current limiting region between 10 and 30 ms and then a shutdown in response to the short circuit protection function occurs at approximately 30 ms. However, if the over current is reduced as measured by DC current sensor 130 and load voltage is below a predetermined threshold level as measured by the voltage sensor 135, the SSPC controller 160 generates an indication that a pre-charge function is active and waits until the output voltage reaches predetermined DC bus level. After detecting the predetermined voltage level, the SSPC controller 160 closes the main switch 120 and generates an indication of a power ready signal.

Figure 4:
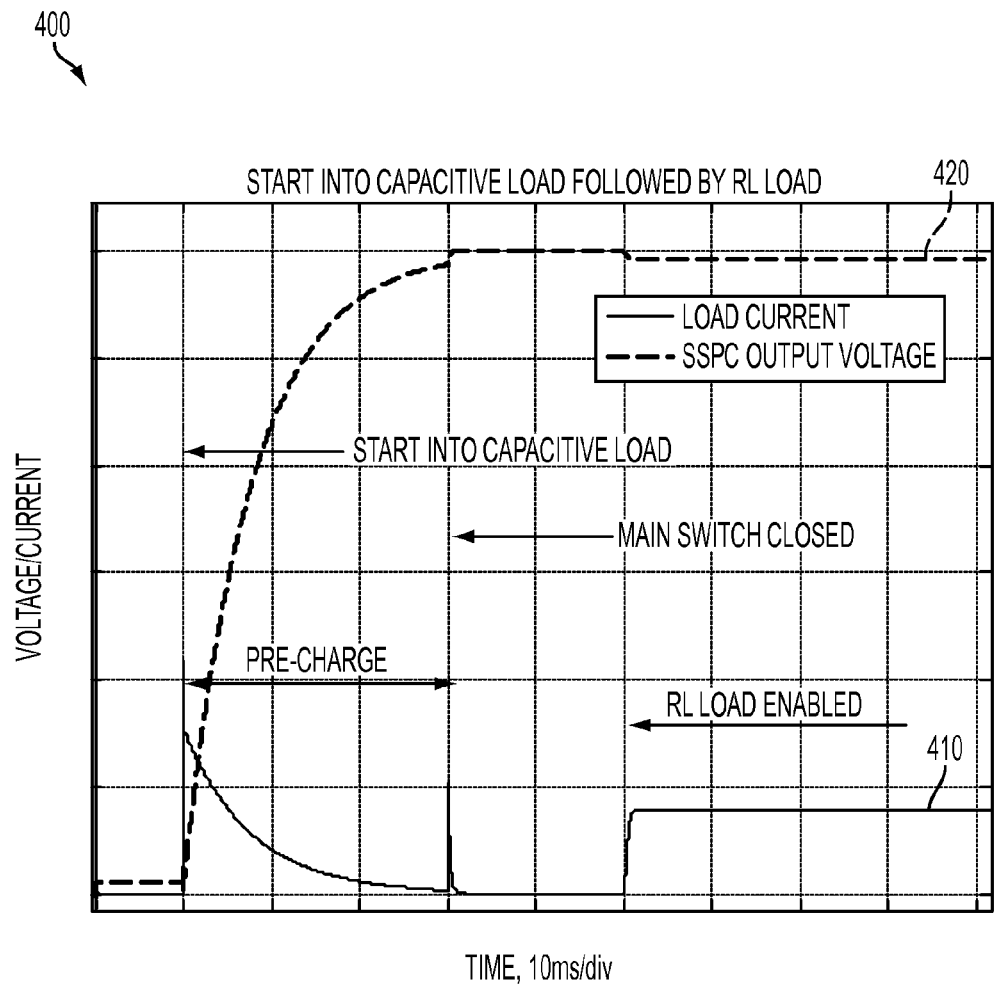
FIG. 4 illustrates an example graph of a load current plot and an SSPC output voltage plot illustrating SSPC operation during pre-charge.

FIG. 4 illustrates an example of a graph showing a load current plot 410 and an SSPC output voltage plot 420, both versus time, for an SSPC controller 160 during a pre-charge of the system 100. FIG. 4 illustrates that the system 100 begins to enter into a capacitive part of the DC load 120 at about 10 ms. The system 100 enters pre-charge between about 10 and 40 ms at which time the main switch 120 is closed as described above. The system 100 then enters the DC load.

Figure 5:
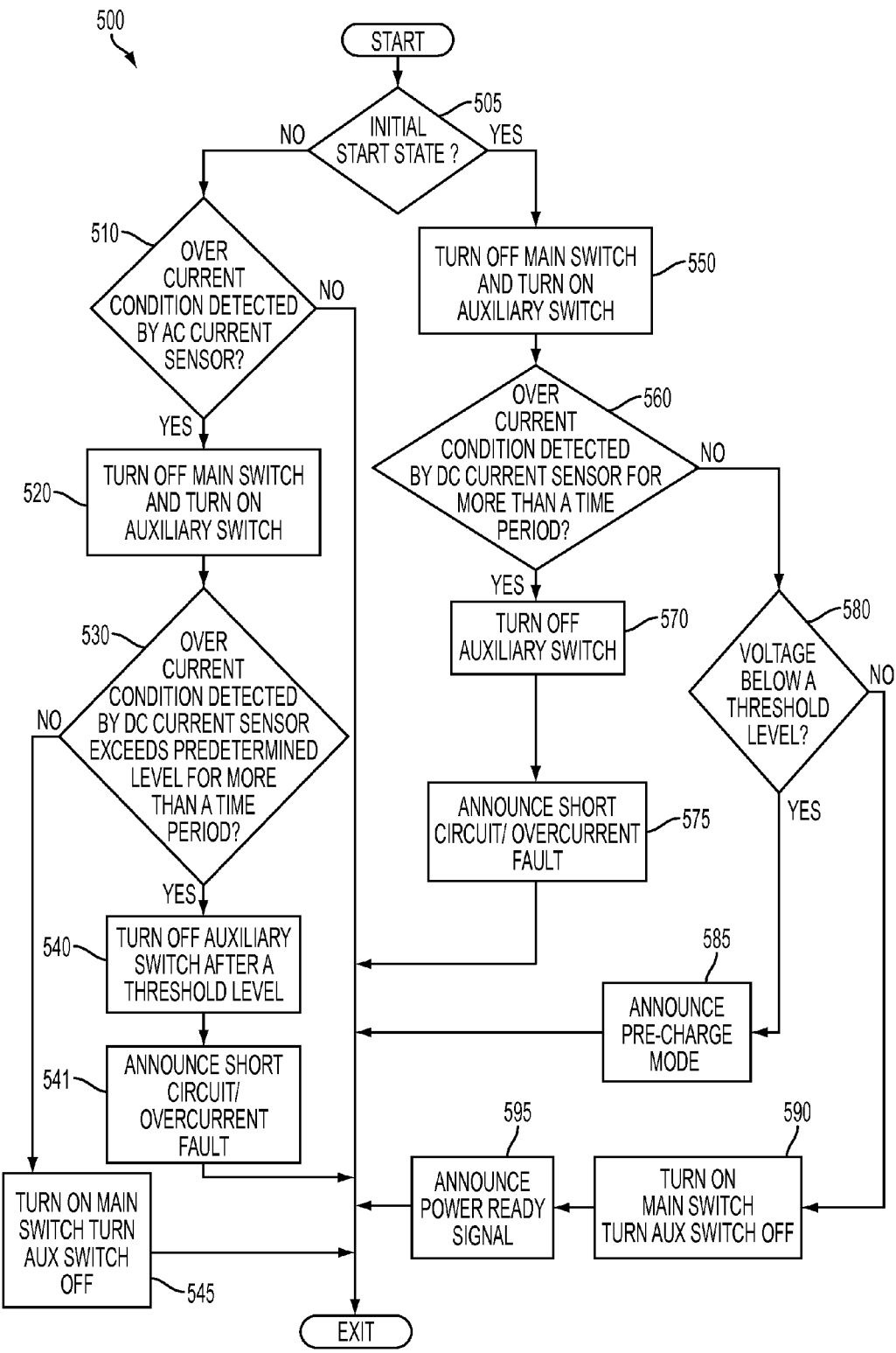
FIG. 5 illustrates a flow chart for a DC load protection method in a high voltage DC system.

FIG. 5 is a flow chart illustrating a DC load protection method 500 for a high voltage DC system. The method 500 illustrates several different functions that can occur in the system 100 as described herein. At block 505, SSPC controller 160 determines if the system 100 is in an initial startup state. If the system 100 is not in an initial startup state at block 505, then at block 510, the SSPC controller 160 determines if there is an over current condition detected by the AC current sensor 125. If there is an over current condition at block 510, then at block 520, the SSPC controller 160 turns off the main switch 120 and turns on the auxiliary switch 140 to current limit the over current through the current limiting resistor 145. At block 530, the SSPC controller 160 determines if the over current has exceeded a predetermined level (via the DC current sensor 130). For example, the over current condition through the DC current sensor 130 exceeds a predetermined level for more than a time period. If the over current has exceeded the predetermined level at block 530, then at block 540, the SSPC controller 160 turns off the auxiliary switch 140, after a specified period of time. Then at block 541, SSPC controller 160 announces a short circuit or overcurrent fault. If there is no over current condition at block 510, the method 500 ends. If the over current has not exceeded the predetermined level at block 530, then the SSPC controller 160 turns on the main switch 120 at block 545, turns off the auxiliary switch 140 and the method 500 ends.

Referring still to FIG. 5, if the system 100 is in an initial startup state at block 505, then at block 510, the SSPC controller 160 turns off the main switch 120 and turns on the auxiliary switch 140 at block 550, then determines if there is an initial over current condition for more than a predetermined threshold at block 560. For example, the over current condition may exceed a pre-determined time period. If there is an initial over current condition at block 560, then at block 570, the SSPC controller 160 turns off the auxiliary switch 140 and announces a short circuit or overcurrent fault at block 575, and the method 500 ends. The SSPC controller 160 can maintain the auxiliary switch 140 off so long as the initial over current condition persists. If at block 560 the overcurrent condition is not detected for longer than the predetermined threshold, SSPC controller 160 determines if the load voltage is below a threshold level at block 580. If the voltage is below the threshold level at block 580, then the SSPC controller 160 announces a pre-charge mode at block 585 and the method 500 ends. If the voltage is not below the threshold level at block 580, then the SSPC controller 160 turns on the main switch 120 at block 590, turns off the auxiliary switch 140 and announces a power ready signal at block 595, and the method 500 ends.

The SSPC controller 160 can be any suitable microcontroller or microprocessor for executing the instructions (e.g., on/off commands) described herein. As such, the suitable microcontroller or microprocessor can be any custom made or commercially available processor, a central processing unit (CPU), an auxiliary processor among several processors, a semiconductor based microprocessor (in the form of a microchip or chip set), a microprocessor, or generally any device for executing software instructions.

Technical effects include the improvement of power quality of a DC bus implementing current limiting, and improvement of nuisance trip avoidance during over current protection. The systems and methods described herein further reduce system weight, size, and cost by eliminating pre-charge function from the switched mode power converter/motor drive.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A solid state power controller (SSPC) system, comprising:
   a direct current (DC) load;
   an SSPC apparatus, including:
      an alternating current (AC) current sensor coupled to the DC load;
      a direct current (DC) current sensor coupled to the DC load;
      a voltage sensor coupled to the DC load;
      a main switch coupled to the DC load via the AC and DC current sensors;
      an auxiliary switch coupled in parallel to the main switch;
      a current limiting resistor coupled in series to the auxiliary switch; and
      an SSPC controller coupled to the main switch, the auxiliary switch, the AC current sensor, the DC current sensor, and the voltage sensor; and
   a DC power source coupled to the SSPC apparatus.

2. The system as claimed in claim 1 wherein the SSPC controller is configured to turn off the main switch in response to an over current condition.

3. The system as claimed in claim 2 wherein the SSPC controller is configured to turn on the auxiliary switch in response to the AC current sensor detecting the over current condition to current limit the over current through the current limiting resistor.

4. The system as claimed in claim 3 wherein the SSPC controller is configured to turn off the auxiliary switch in response to the DC current sensor detecting the over current above a predetermined current level and for more than a predetermined time period.

5. The system as claimed in claim 1 wherein the SSPC controller is configured to turn on the auxiliary switch prior to the main switch and determine an initial over current condition.

6. The system as claimed in claim 5 wherein the SSPC controller is configured to generate a pre-charge indication in response to the voltage sensor measuring a load voltage below a predetermined voltage threshold, and a rate of current change during initial start-up.

7. The system as claimed in claim 6 wherein the SSPC controller is configured to turn on the main switch in response to the voltage sensor measuring a load voltage above a predetermined voltage level during a pre-charge state.

8. The system as claimed in claim 1 wherein the DC power source includes a positive rail and a negative rail.

9. The system as claimed in claim 8 further comprising an overvoltage protection diode bridging the positive rail and the negative rail.

10. A solid state power controller (SSPC) apparatus, comprising:
   an alternating current (AC) current sensor coupled to a DC load;
   a direct current (DC) current sensor coupled to the DC load;
   a voltage sensor coupled to the DC load;
   a main switch coupled to the DC load via the AC and DC current sensors;
   an auxiliary switch coupled in parallel to the main switch;
   a current limiting resistor coupled in series to the auxiliary switch; and
   a SSPC controller coupled to the main switch, the auxiliary switch, the AC current sensor, the DC current sensor, and the voltage sensor.

11. The apparatus as claimed in claim 10 wherein the SSPC controller is configured to turn off the main switch in response to an over current condition.

12. The apparatus as claimed in claim 11 wherein the SSPC controller is configured to turn on the auxiliary switch in response to the over current condition to current limit the over current through the current limiting resistor.

13. The apparatus as claimed in claim 12 wherein the SSPC controller is configured to turn off the auxiliary switch in response to the DC current sensor detecting the over current above a predetermined current level and for more than a predetermined time period.

14. The apparatus as claimed in claim 10 wherein the SSPC controller is configured to turn on the auxiliary switch prior to the main switch and determine an initial over current condition.

15. The apparatus as claimed in claim 14 wherein the SSPC controller is configured to generate a pre-charge indication in response to the voltage sensor measuring a load voltage below a predetermined voltage threshold.

16. The apparatus as claimed in claim 15 wherein the SSPC controller is configured to turn on the main switch in response to the voltage sensor measuring a load voltage above a predetermined voltage level and a rate of current change during initial start-up.

17. A direct current (DC) load protection method in a high voltage DC (HVDC) system, the method comprising:
   in response to a detection of an over current condition, turning off a main switch in the HVDC system, and turning on an auxiliary switch in the HVDC system to current limit the over current through a current limiting resistor coupled to the auxiliary switch;
   in response to the over current exceeding a predetermined level, turning off the auxiliary switch;
   turning on the auxiliary switch;
   determining an initial over current condition;
   in response to detecting a HVDC system load voltage below a predetermined threshold, and a rate of current change during initial start-up, generating a pre-charge indication; and
   in response to detecting a load voltage above a predetermined voltage level, turning on the main switch after completion of pre-charge mode.

* * * * *